United States Patent [19]

Neumann et al.

[11] 4,329,643
[45] May 11, 1982

[54] PORTABLE CIRCUIT TESTING SYSTEM

[76] Inventors: Manfred H. Neumann, Michel Klinitz Weg 17, 100 Berlin 47; Günter H. Wallstab, Planufer 92E, 1000 Berlin 61; Lutz R. Heike, Kaiserin Augusta Allee 36, 1000 Berlin 10; Frank U. Zimmerman, Tacitusstr. 12A, 1000 Berlin 42, all of Fed. Rep. of Germany; Lawrence A. Durante, Box 44, APO, N.Y. 09611

[21] Appl. No.: 129,859

[22] Filed: Mar. 13, 1980

[51] Int. Cl.³ ............... G01R 31/02; G08B 29/00
[52] U.S. Cl. ............................ 324/158 F; 340/514
[58] Field of Search ............ 324/158 F, 158 R, 73 R; 340/514

[56] References Cited

U.S. PATENT DOCUMENTS 3,808,532  4/1974  Yuska ....................... 324/158 F
4,230,986  10/1980  Deaver et al. ............. 324/158 F Primary Examiner—Ernest F. Karlsen
Attorney, Agent, or Firm—Donald J. Singer; Henry S. Miller

[57] ABSTRACT

A portable system for testing and adjusting security alarm system modules where an alarm module is removed from the security system and inserted into the test system, an adapter card, connected to the test system, replaces the module, whereby the alarm system continues to function normally, the alarm circuit is then tested for voltage, current and continuity and necessary adjustments made.

4 Claims, 3 Drawing Figures

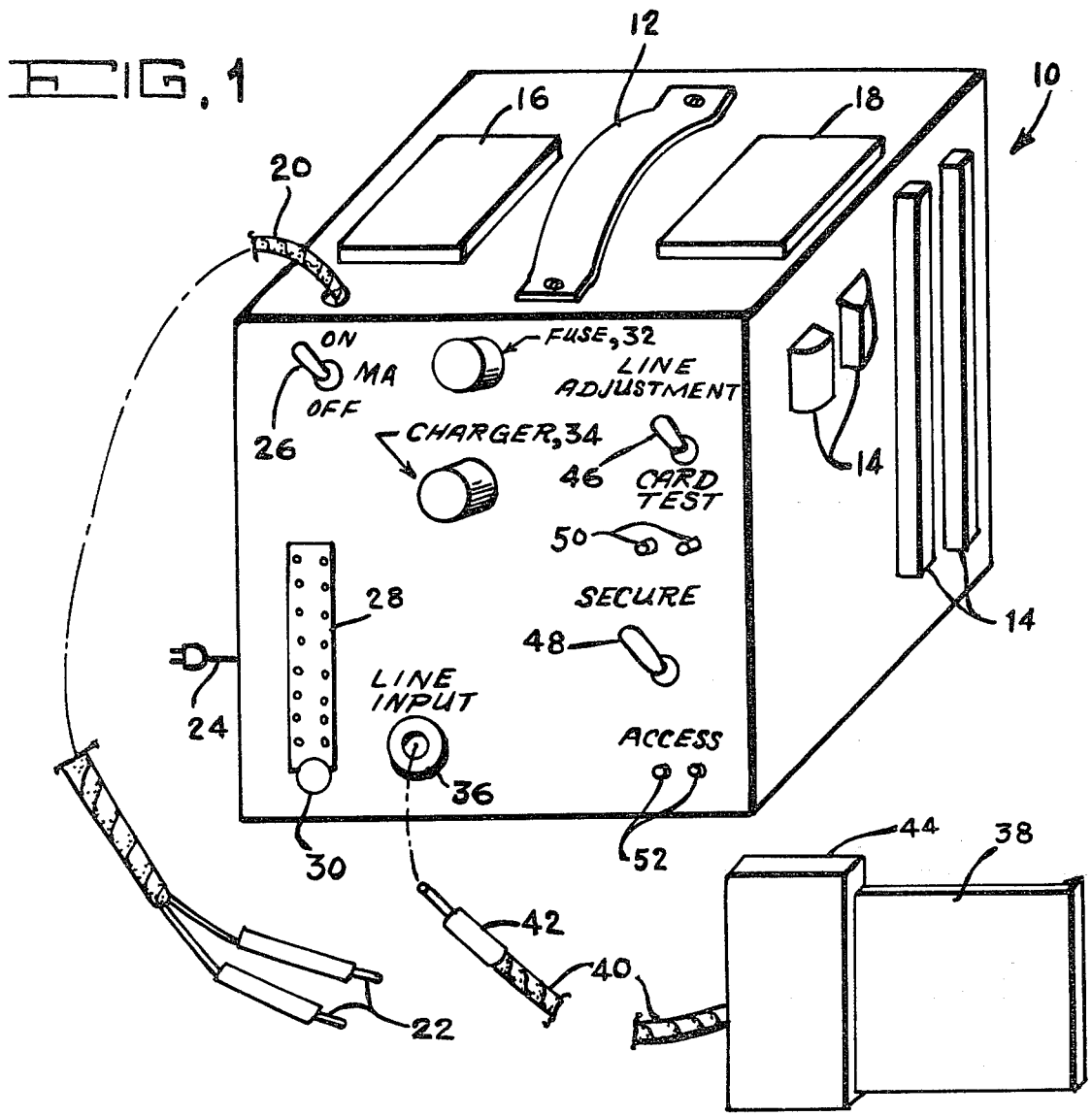
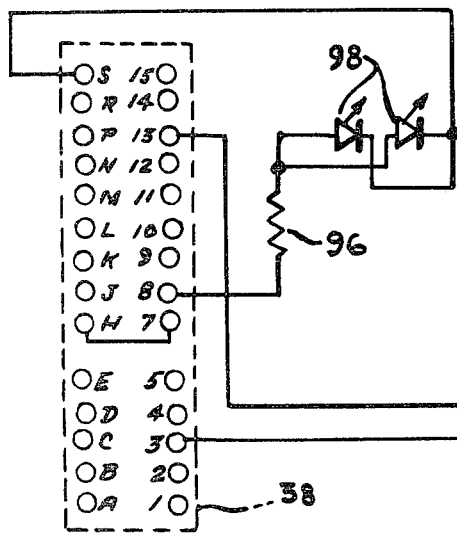

PORTABLE CIRCUIT TESTING SYSTEM

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a portable system for testing electrical circuits and more specifically to a system which prevents interruption in circuit function during testing.

Normally, testing electric circuits is a relatively simple task. However, in a case where the circuit is formed on a board and the board is a part of a larger system which cannot be practically shut down, the problem becomes more difficult. Those which cause particular difficulty are electronic alarm security systems. These systems include a number of sensing units placed at strategic locations around an area or within a building. All sensors would be connected to a master security panel located in a security office on or off the premises. The advantage to such a system is easily seen where one person can monitor a large panel containing substantial numbers of alarms with a single glance.

Operation of security systems is simple, with a light and/or an audible alarm being activated by the remote sensing detector. Means are provided to allow access without activating the sensor and means are provided to reset the alarm once it has been activated.

Maintenance and repair of the system is far more complex and sensitive than the operation. Since there are usually a number of sensors to any system, there will be a corresponding number of alarm modules mounted, usually in a unified master panel for ease in monitoring. When one module needs maintenance, the particular sensor connected to it has to be shut down. Additionally, as a practical matter, maintenance personnel working around a master security panel tend to disrupt operations, block the panel from the view of security people and tend to cause alarm indications which are attributed to maintenance, thereby masking true alarms.

A typical security system is manufactured by the American District Telegraph Co (ADT) model 5930-018. This system utilizes readout modules in the master panel which are the supervisory and control elements of the alarm system. The readout module consists of a front plate which mounts in the master panel. This plate contains lights for indicating an alarm visually and switches for setting or resetting the alarm system. An audio alarm is also a part of the master panel.

Transverse to the front plate is a circuit board which is hidden behind the front panel when mounted in master panel. The circuit board contains all the necessary circuitry to cause the system to function and contains a plug-in feature whereby readout modules are simply plugged into the master panel.

Readout modules must be periodically checked and readjusted due to changes in temperature, age and line voltage. Occasionally, a malfunction in the system will require that the module be examined for defects.

Currently available maintenance equipment for testing readout modules is difficult to use, particularly in cramped quarters where master panels tend to be located. They contain meters that are difficult to read and their use tends to cause the master panel to be obscured either in whole or in part. Additionally, existing equipment causes the master panel audio alarm signal to function during testing thereby possibly allowing a working active module to be inadvertently compromised.

Additionally, there is no means for bench testing readout modules short of inserting them into an active system. Similarly, there is no way of training personnel on the maintenance of these systems modules except by utilizing an active alarm system.

The invention proposed herein solves the outlined short comings of existing alarm systems.

SUMMARY OF THE INVENTION

The invention is a portable system for testing electronic security alarm modules without interrupting the system security function of that system.

The test system utilizes a card adapter to substitute for the alarm module in the master panel. An extension cord connects the card to the test circuit which is contained in a compact box like enclosure. The alarm module is plugged into the test circuit where it is tested and adjusted. In the event of genuine intrusion the alarm will function normally. The extension cord allows the module to be tested away from the master control panel. Likewise the system will function in the configuration stated for long periods in the event intermittent voltage problems are to be monitored.

The test unit will test for line voltage and current under both "secure" and "access" conditions. Since the test unit contains battery power and is otherwise self-sufficient in lieu of a master control panel, the system will serve as a mock up for bench testing alarm modules. The test unit also contains a pair of test leads, connected by an extension cord for testing voltages.

It is therefore an object of the invention to provide a new and improved portable circuit testing system.

It is another object of the invention to provide a portable circuit testing system for security alarm circuits.

It is a further object of the invention to provide a portable circuit testing system for security alarm circuits that allows the alarm circuit to function during testing.

It is another object of the invention to provide a portable circuit testing system that provides more distinct and more exact readings than any hitherto known system.

It is still a further object of the invention to provide a new and improved alarm circuit test system that enables maintenance in inaccessible areas.

It is still another object of the invention to provide a new and improved alarm circuit test system that allows module testing and maintenance apart from a master circuit control system.

It is another object of the invention to provide an alarm circuit test unit that will differentiate between actual alarms and those caused by maintenance and testing.

It is another object of the invention to provide a circuit test unit that is low in cost and simple to operate.

It is another object of the invention to provide a portable electronic circuit test unit that reduces the maintenance time for alarm circuits by twenty five percent.

These and other advantages, features and objects of the invention will become more apparent from the following description taken in connection with the illustrative embodiment in the accompanying drawings.

DESCRIPTION OF THE DRAWINGS

FIG. 1 is a pictorial representation of the test unit.
FIG. 3 is a circuit diagram of the adapter card utilized in the invention.

DESCRIPTION OF THE PREFERRED EMBODIMENT

Figure 2:
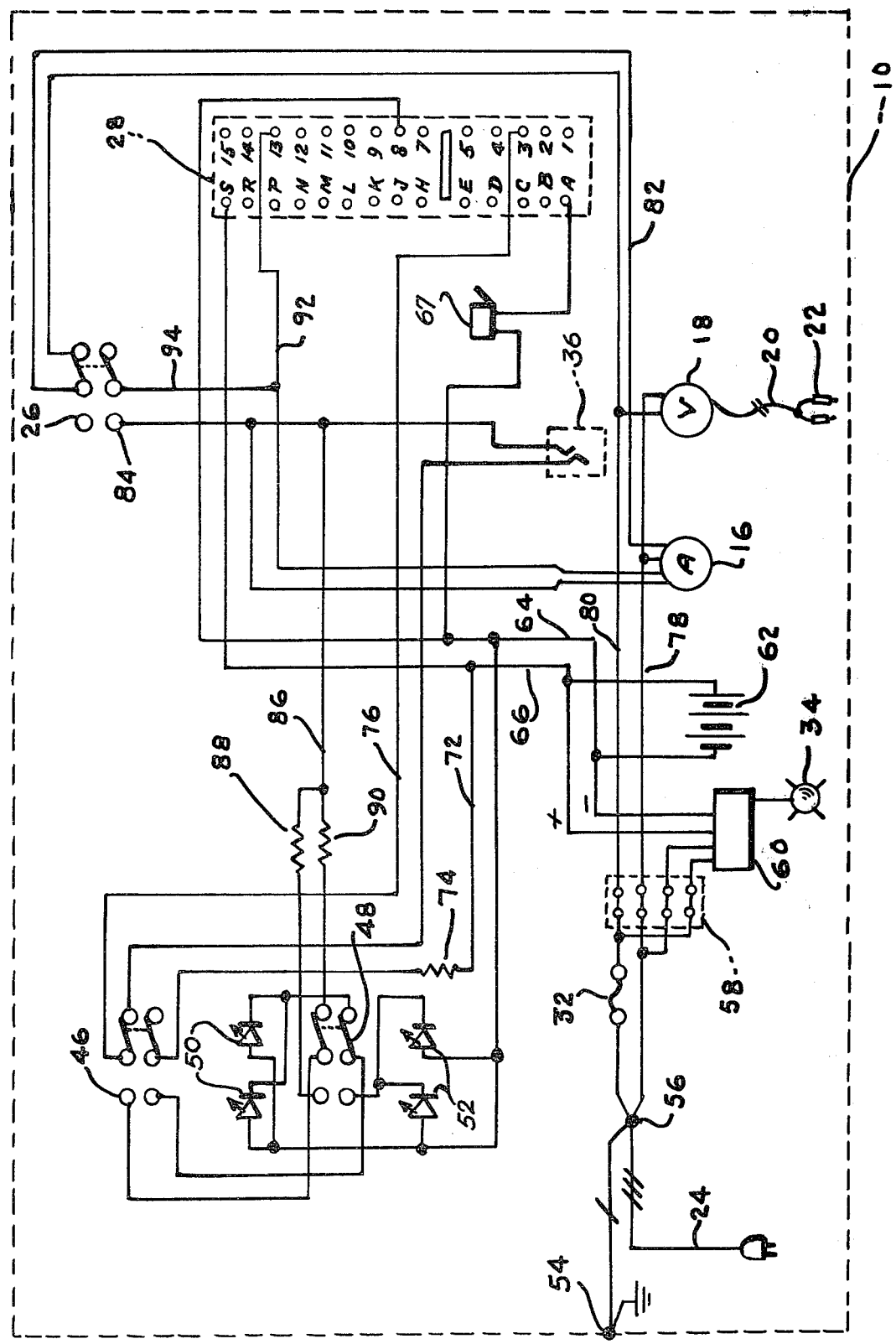
FIG. 2 is a circuit diagram of the test system.

Referring now to FIG. 1, the test circuit is contained in a portable carrying case, shown generally at 10. The case is equipped with a carrying means 12 and appropriate clasps 14 to carry accessory equipment on the outside of the case.

On the top of the case are two indicator panels 16, 18 for digitally showing milliamperage and voltage. Also exiting through the top of the case is a flexible cord 20 which ends with two probes 22 for testing voltage. A cord 24 for line power exits through the rear of the case.

The front panel of the unit contains a two way toggle switch 26 which activates or deactivates the milliampere function. Below this switch is a female socket 28 particularly adapted to receive the alarm module being tested. A pin 30 is added below the socket to provide mechanical support for the alarm module.

A fuse 32 is placed immediately above charging indicator light 34. A standard female phone jack 36 is used for line input, which is received from adapter card 38 via flexible line extension or cable 40 and male phone plug 42. The adapter card is equipped with a wooden handling portion 44 and is substituted for the alarm module in the master control panel during maintenance and testing.

Two way function switch 46 provides for line adjustment in the master control panel and module or card test when the alarm module is inserted in socket 28.

For alarm module testing, function switch 48 provides a pair of redundant green luminescent diodes 50 for secure and amber luminescent diodes 52 for the access condition.

Referring now to FIG. 2 a circuit diagram is shown for the test unit. The dashed line surrounding the circuit represents the metal container 10. The circuit is grounded to the case at 54. Input line power (110/220/240 VAC) enters via three wire cord 24 which has its separate wires or lines divided at 56 to separate circuit connections. One line is fused (32) and enters terminal block 58, the other line connects the terminal block directly. From terminal 58 a pair of lines go directly to battery charger 60 with charger light 34, and thence to 6 volt battery 62. Battery power is supplied via lines 64, 66 to female socket 28 and contacts labled S and 8. Power is taken from line 64 to operate buzzer 67 which is connected to contact A on socket 28. Additionally power from line 64 supplies luminescent diodes 50, 52 functioning in conjunction with switch 48 shown in the secure position for a module function test.

Power is also taken from line 66 via line 72 and resistor 74 for switch 46, shown in the line test position for milliampere adjustment. Switch 46 is connected via line 76 to contact 3 on female socket 28.

Line power passing through terminal block 58 is connected via line 78 to digital milliampere meter 16 and voltmeter 18. Cord 20 and probes 22, are connected to the voltmeter. The switch 26 has connections via line 80 to the voltmeter 18 and terminal 58 and also to millimeter 16 via line 82.

Contact 84 of switch 26 is connected in the off position to the female phone jack 36 and milliampere meter 16. Additionally, switch 48 is connected via lines 86 and resistors 88 and 90 to contact 84 of switch 26 and female phone jack 36.

Milliampere meter 16 is connected to contact 13 of socket 28 via line 92 which also connects switch 26 via line 94.

FIG. 3 shows adapter card (38) and connections necessary for the particular alarm system shown as an example herein. Male adapter plug 42 is connected via line 40 to contacts 3 and 13 on the card. Points 8 and S are interconnected through resistor 96 and luminescent diodes 98. A jumper connects contacts H and 7.

In operation an alarm module is removed from the master control panel and an adapter card substituted. The adapter card 38 is plugged into the test unit via phone plug 42. The alarm module is plugged to female socket 28 on the unit and the security system continues to function normally.

Checks are made on the alarm module with the voltage probes 22 and the line adjustment position of switch 46. An internal buzzer is activated when tests are performed on the alarm module, thereby eliminating confusion with other security alarm modules.

In the event a bench test is desired, the alarm module is plugged into the circuit, switch 46 moved to card test and switch 48 moved between secure and access.

The unit may be left in place and the security system operated in the event long term observation of the circuit is required.

Although the invention has been described with reference to a particular embodiment it will be understood to those skilled in the art that the invention is capable of a variety of alternative embodiments within the spirit and scope of the appended claims.

What is claimed is:

1. In a security system having a master panel with an audio alarm and readout module subsystems, each module subsystem having indicator lights for visually indicating a tripping of the subsystem for alarm indication, and switches for setting or resetting the alarm subsystem, and a connector as a part thereof adapted to mate with a module mounting mating connector on said master panel, the improvement comprising a test arrangement which allows for regular operation or testing and adjustment of a module at a position remote from said master panel, said test arrangement comprising
a card adapter including a connector configured to mate with a module mounting connector of said master panel and an extension cable having wires connected at one end with said card adapter connector and at the other end with a second connector,
a test unit having a mounting connector configured to correspond to a mounting connector on said master panel for mounting a module to be tested, a third connector adapted to join with said second connector of said card adapter for transmitting any signal directed from said master panel to a module to be tested to allow for remote operation and testing of a module mounted in said test unit, a power supply, and switching means for selectively connecting said card adapter extension cable to a module to be tested for operation of said module by said master panel and for applying internally generated signals from said power supply to provide a test of said module.

2. In a security system as defined in claim 1 wherein said improvement includes said card adapter having means to indicate power output from said master panel to said card.

3. In a security system as defined in claim 1 the improvement including means for enabling the power supply of said test unit to allow for bench testing of a module without access to a master panel.

4. In a security system as defined in claim 1 wherein said test unit includes an audible alarm different from that utilized with said master panel for checking operation of said module.

* * * * *